United States Patent
Dube et al.

(10) Patent No.: US 11,457,546 B2
(45) Date of Patent: Sep. 27, 2022

(54) SYSTEM AND METHOD FOR HIGH VOLTAGE ISOLATION WITH THERMAL CONDUCTIVITY

(71) Applicant: Raytheon Company, Waltham, MA (US)

(72) Inventors: Richard P. Dube, Barre, MA (US); Mark S. Langelier, Harrisville, RI (US); Paul A. Sefcsik, Jr., Narragansett, RI (US); Jason P. Rosa, Attleboro, MA (US); Curtis B. Carlsten, Seekonk, MA (US); Michael F. Janik, Portsmouth, RI (US); Mark R. Franklin, Jr., Dartmouth, MA (US)

(73) Assignee: Raytheon Company, Waltham, MA (US)

( * ) Notice: Subject to any disclaimer, the term of this patent is extended or adjusted under 35 U.S.C. 154(b) by 69 days.

(21) Appl. No.: 17/066,391

(22) Filed: Oct. 8, 2020

(65) Prior Publication Data

US 2022/0117110 A1    Apr. 14, 2022

(51) Int. Cl.
*H05K 7/20*        (2006.01)
(52) U.S. Cl.
CPC .................. *H05K 7/2039* (2013.01)
(58) Field of Classification Search
CPC ........... H05K 7/20518; H05K 7/20509; H05K 7/205; H05K 7/20436; H05K 7/20409; H05K 7/2039; H05K 1/181
See application file for complete search history.

(56) References Cited

U.S. PATENT DOCUMENTS

| | | | |
|---|---|---|---|
| 6,248,080 B1 * | 6/2001 | Miesel ................ | A61B 5/0215 600/311 |
| 6,351,383 B1 * | 2/2002 | Payton ................ | H05K 7/1434 361/744 |
| 6,703,561 B1 | 3/2004 | Rosenberg et al. | |
| 7,215,557 B2 * | 5/2007 | Glovatsky ............ | H05K 1/144 361/792 |
| 8,942,005 B2 * | 1/2015 | Geswender .......... | F42B 30/006 361/810 |
| 2005/0089280 A1 * | 4/2005 | Kumar ............... | H01S 5/02212 257/E23.19 |
| 2010/0296258 A1 * | 11/2010 | Geswender .......... | H05K 1/144 361/803 |
| 2015/0319886 A1 | 11/2015 | Albrecht, III et al. | |
| 2017/0311478 A1 * | 10/2017 | Engelhardt ......... | H01L 23/4275 |
| 2019/0330496 A1 | 10/2019 | Fukushi et al. | |

(Continued)

OTHER PUBLICATIONS

Parker Chomerics, "Thermal Interface Materials for Electronics Cooling" catalog, https://www.parker.com/parkerimages/Parker.com/Divisions-2011/Chomerics%20Division/SupportAsset/Thermal_Interface_Materials_Catalog.pdf, 56 pgs.

(Continued)

*Primary Examiner* — Adam B Dravininkas

(57) ABSTRACT

A system includes a first slice and a second slice coupled to each other. Each slice includes a housing formed of an electrically-insulative material, a ceramic plate disposed at each end of the housing, and an end plate disposed over each of the ceramic plates. Each end plate is formed of a thermally-conductive material. The system also includes a backplane assembly coupled to the first slice and the second slice.

20 Claims, 11 Drawing Sheets

(56) References Cited

U.S. PATENT DOCUMENTS

2020/0022284 A1* 1/2020 Kita ................. H01F 27/22
2020/0062607 A1   2/2020 Itoya et al.
2021/0085163 A1* 3/2021 Chen ................ A61B 1/0661

OTHER PUBLICATIONS

International Search Report and Written Opinion of the International Searching Authority dated Jan. 18, 2022 in connection with International Patent Application No. PCT/US2021/053554, 10 pages.

* cited by examiner

SYSTEM AND METHOD FOR HIGH VOLTAGE ISOLATION WITH THERMAL CONDUCTIVITY

TECHNICAL FIELD

This disclosure is directed in general to power and thermal management systems. More specifically, this disclosure relates to a system and method for high voltage isolation with thermal conductivity.

BACKGROUND

Oil-filled vessels or dry insulative tubes have often been used to achieve heat dissipation and high voltage isolation. Oil-filled vessels achieve both heat dissipation and high voltage isolation. However, such vessels are messy, costly, difficult to rework, and environmentally insensitive. Insulative tubes only achieve high voltage isolation but offer little or no thermal transfer.

SUMMARY

This disclosure provides a system and method for high voltage isolation with thermal conductivity.

In a first embodiment, a system includes a first slice and a second slice coupled to each other. Each slice includes a housing formed of an electrically-insulative material, a ceramic plate disposed at each end of the housing, and an end plate disposed over each of the ceramic plates. Each end plate is formed of a thermally-conductive material. The system also includes a backplane assembly coupled to the first slice and the second slice.

In a second embodiment, a system includes a hotel power slice and multiple accessory slices coupled together. Each slice includes a housing formed of an electrically-insulative material, a ceramic plate disposed at each end of the housing, and an end plate disposed over each of the ceramic plates. Each end plate is formed of a thermally-conductive material. The system also includes a backplane assembly coupled to the hotel power slice and the accessory slices.

In a third embodiment, a method includes providing first and second slices. Each slice includes a housing formed of an electrically-insulative material, a ceramic plate disposed at each end of the housing, and an end plate disposed over each of the ceramic plates. Each end plate is formed of a thermally-conductive material. The method also includes coupling the slices together. The method further includes attaching a backplane assembly to the first and second slices.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 12, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

As discussed above, both oil-filled vessels or dry insulative tubes have often been used to achieve heat dissipation and high voltage isolation. Oil-filled vessels achieve both heat dissipation and high voltage isolation. However, such vessels are messy, costly, difficult to rework, and environmentally insensitive. Insulative tubes only achieve high voltage isolation but offer little or no thermal transfer.

This disclosure provides for electrically isolating an electronics assembly or other heat source in a closed environment (such as a power feed branching unit) while thermally conducting heat (thermal energy) away from the electronics assembly or other heat source. The disclosed systems and methods are cost effective, easily producible, and easily reworkable in the event of repairs or maintenance. The disclosed systems and methods provide a solution for thermal and high voltage management without the use of oil in a closed vessel. In some embodiments, the disclosed systems and methods can be used for housing telecommunications equipment in a pressure vessel for subsea applications, although any other suitable applications are within the scope of this disclosure.

Figure 1:
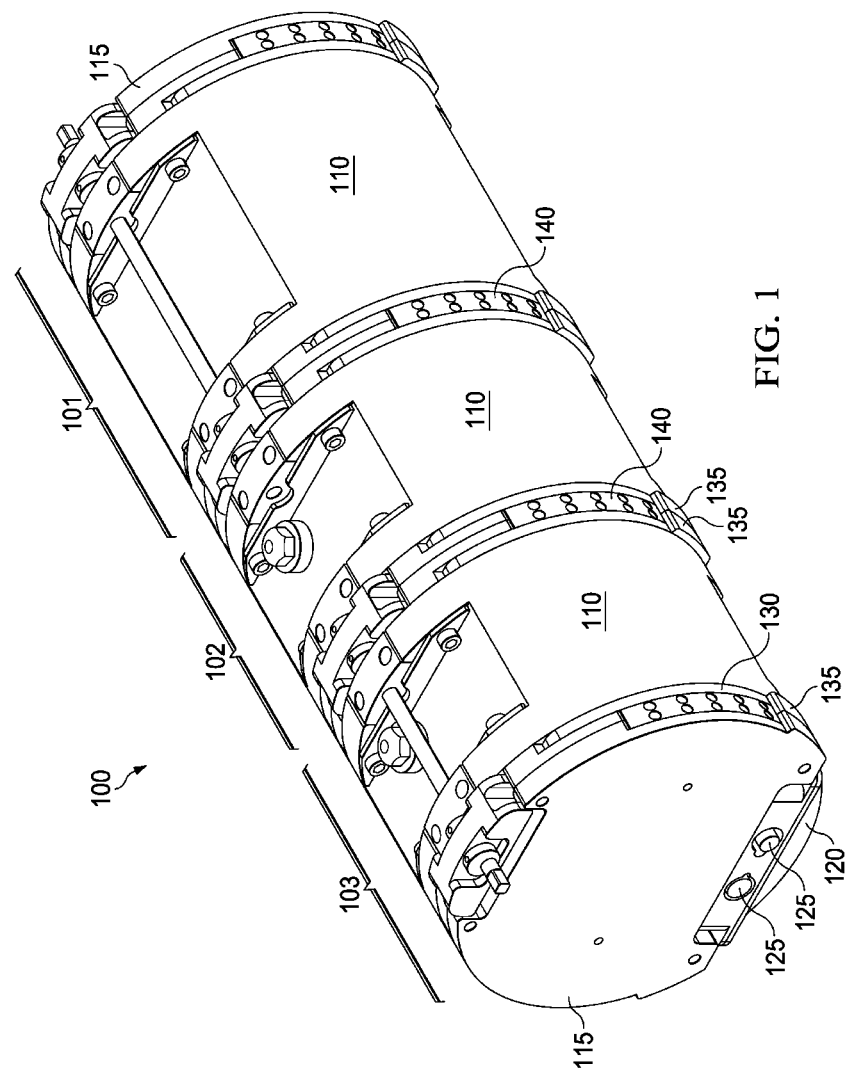
FIGS. 1 through 3 illustrate an example thermally conductive, electrically insulated (TCEI) system according to this disclosure.
Figure 2:
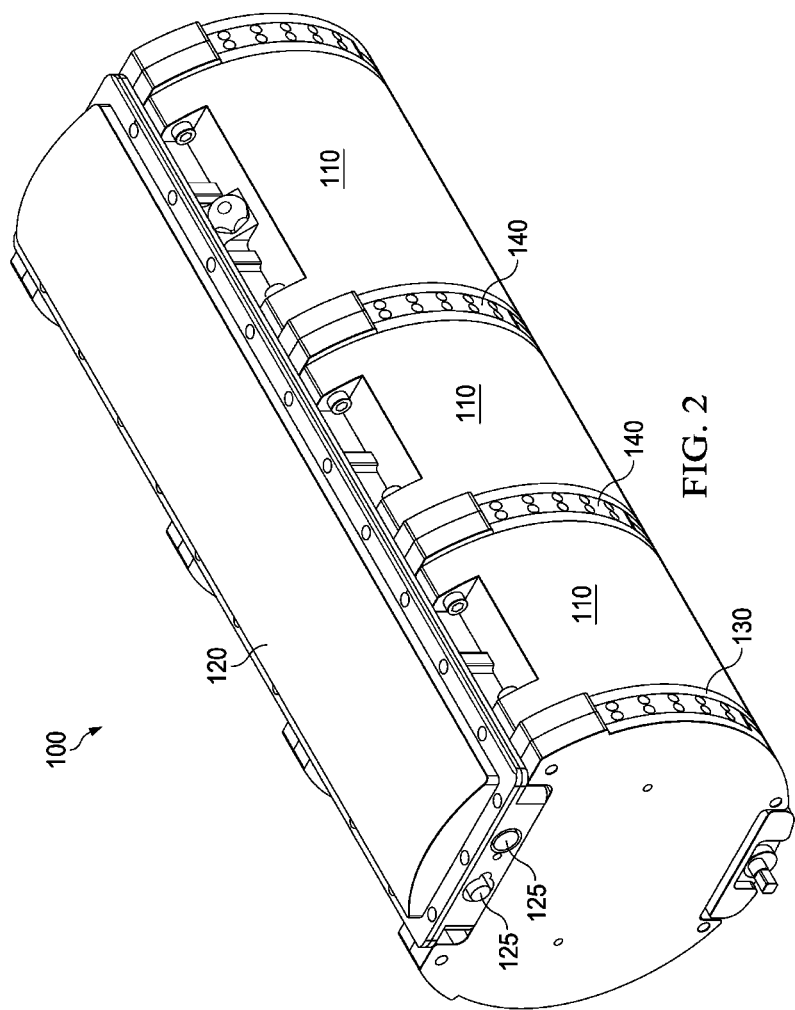
Figure 3:
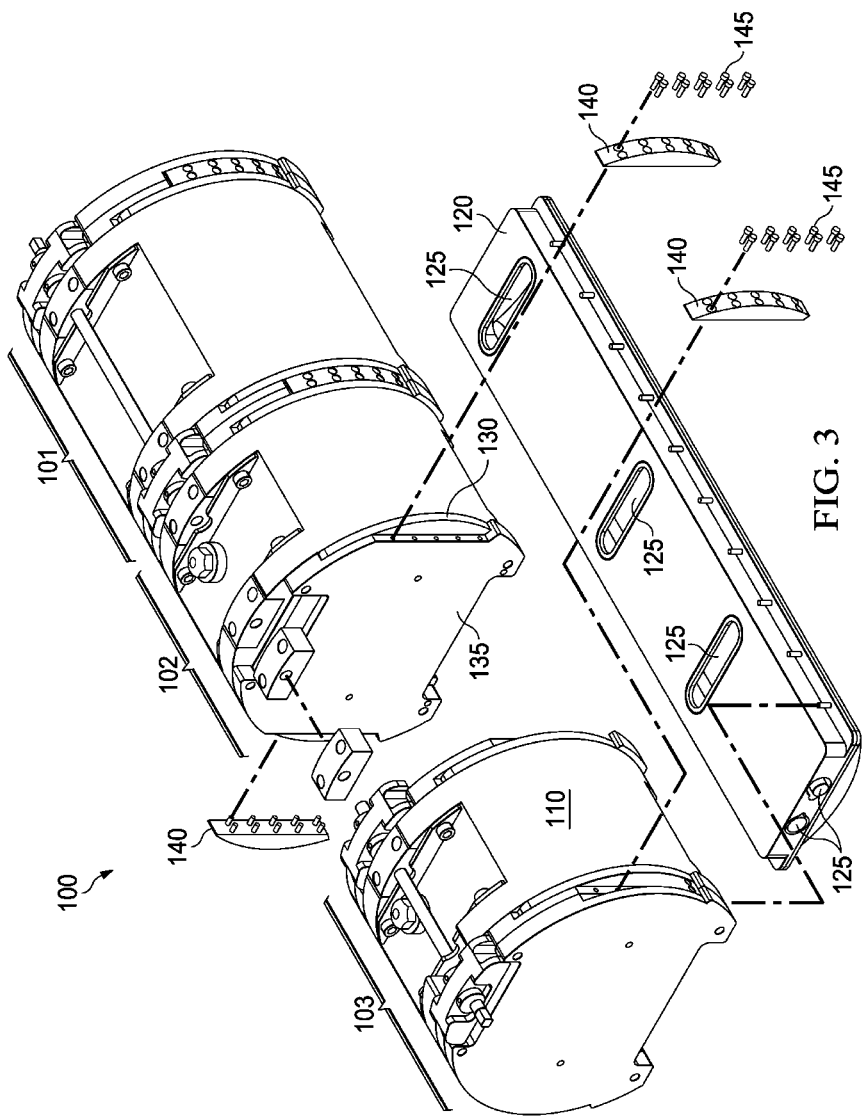

FIGS. 1 through 3 illustrate an example thermally conductive, electrically insulated (TCEI) system 100 according to this disclosure. In particular, FIG. 1 shows a top isometric view of the TCEI system 100, FIG. 2 shows a bottom isometric view of the TCEI system 100, and FIG. 3 illustrates a partially exploded view of the TCEI system 100. In some embodiments, the TCEI system 100 is configured to be inserted inside a pressure vessel, which may be submerged in a subsea environment or other environment.

As shown in FIG. 1 through 3, the TCEI system 100 includes a reconfigurable optical add drop multiplexer (ROADM) and hotel power slice 101 and multiple accessory slices 102-103. While the TCEI system 100 is shown with two accessory slices 102-103, this is merely one example, and other embodiments may include other numbers of accessory slices 102-103. Each end of the TCEI system 100 is covered with an end plate 115. In some embodiments, each end plate 115 is formed of aluminum, such as 6061-T6 aluminum alloy, although other suitable materials are possible and within the scope of this disclosure. In some embodiments, each end plate 115 includes one or more fastening or locking mechanisms to attach the end plate 115 to the corresponding slice 101, 103.

The ROADM and hotel power slice 101 is configured to house one or more ROADMs and one or more hotel power components for operation of the TCEI system 100. In some embodiments, the ROADM and hotel power slice 101 can house one or more processors, circuit card assemblies (CCAs), hotel power sources, optical network components, other electronic components, other heat sources, or any combination of these. One, some, or all of these components may operate at high voltages or other potentials that are different from seawater ground or other external ground and thus need to be electrically insulated from the exterior environment. Also, one, some, or all of these components may generate thermal energy that needs to be dissipated from the interior of the ROADM and hotel power slice 101 to prevent overheating. While the embodiments described herein include the ROADM(s) and the hotel power component(s) disposed in one slice 101, this is merely one example. In other embodiments, ROADM(s) and hotel power component(s) could be housed in separate slices.

Each accessory slice 102-103 is configured to house one or more electronic components or other heat sources that receive power from the accessory slice 102-103 itself or from a power source disposed in the ROADM and hotel power slice 101. In some embodiments, each accessory slice 102-103 is configured as an about 1 kW slice, although other power levels are possible and within the scope of this disclosure. As in the ROADM and hotel power slice 101, one, some, or all of the electronic components disposed in each accessory slice 102-103 may operate at high voltages or other potentials that are different from seawater ground or other external ground and thus need to be electrically insulated from the exterior environment. Also, one, some, or all of the electronic components disposed in each accessory slice 102-103 may generate thermal energy that needs to be dissipated from the interior of the accessory slice 102-103 to prevent overheating.

Each of the slices 101-103 can be independently assembled and sealed. Each of the slices 101-103 includes a housing 110 that is electrically insulative. In some embodiments, the housing 110 is formed of nylon, although other electrically-insulative materials are possible and within the scope of this disclosure. Positioned at ends of each slice 101-103 are ceramic plates 130 and end plates 135. Each ceramic plate 130 provides a thermal path between one or more heat generating components disposed with the slice 101-103 and the associated end plate 135. While each ceramic plate 130 is a good conductor of thermal energy, each ceramic plate 130 is electrically insulative such that it electrically isolates the internal component(s) from the external environment. In some embodiments, each ceramic plate 130 is formed of boron nitride or aluminum nitride, although other suitable materials are possible and within the scope of this disclosure. Each end plate 135 provides a thermal path between the associated ceramic plate 130 and the pressure vessel. In some embodiments, each end plate 135 is formed of aluminum, such as 6061-T6 aluminum alloy, although other suitable materials are possible and within the scope of this disclosure.

On the bottom side of the TCEI system 100 in this example is a backplane assembly 120. The backplane assembly 120 is coupled to each of the slices 101-103 so as to create a hermetic seal between the backplane assembly 120 and each slice 101-103. The backplane assembly 120 is formed of an electrically-insulative material (such as nylon) and includes multiple high-voltage conductor and fiber feedthroughs 125 for passage of cables, wires, or other connectors between each of the slices 101-103 and exterior portions of the TCEI system 100. The cables, wires, or connectors provide power, data transfer, and the like to or from one or more components disposed within each slice 101-103.

Adjacent slices 101-103 are aligned such that the end plates 135 of adjacent slices 101-103 are also in alignment as shown in FIG. 1. The adjacent slices 101-103 are coupled together, such as by using multiple slice joining plates 140 and fasteners 145. Of course, the slice joining plates 140 and fasteners 145 shown in FIGS. 1 through 3 are mere examples, and other joining mechanisms are possible and within the scope of this disclosure. The backplane assembly 120 is attached to the adjacent slices 101-103 as shown in FIGS. 1 and 2 so as to form a substantially cylindrical overall shape for the TCEI system 100. The substantially cylindrical shape of the TCEI 100 enables easy loading of the TCEI system 100 into a pressure vessel.

Figure 4:
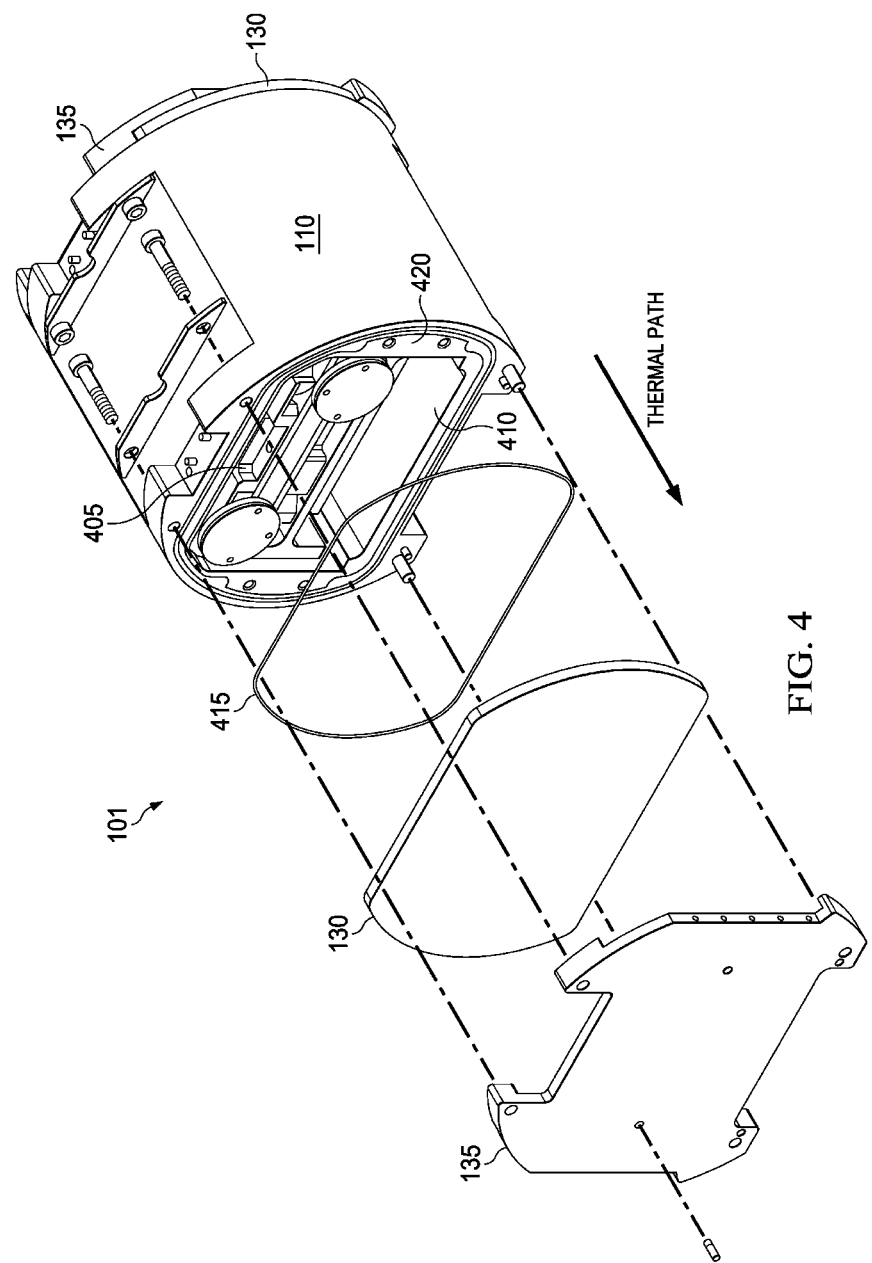
FIGS. 4 through 6 illustrate further details of an example reconfigurable optical add drop multiplexer (ROADM) and hotel power slice of FIGS. 1 through 3 according to this disclosure.
Figure 5:
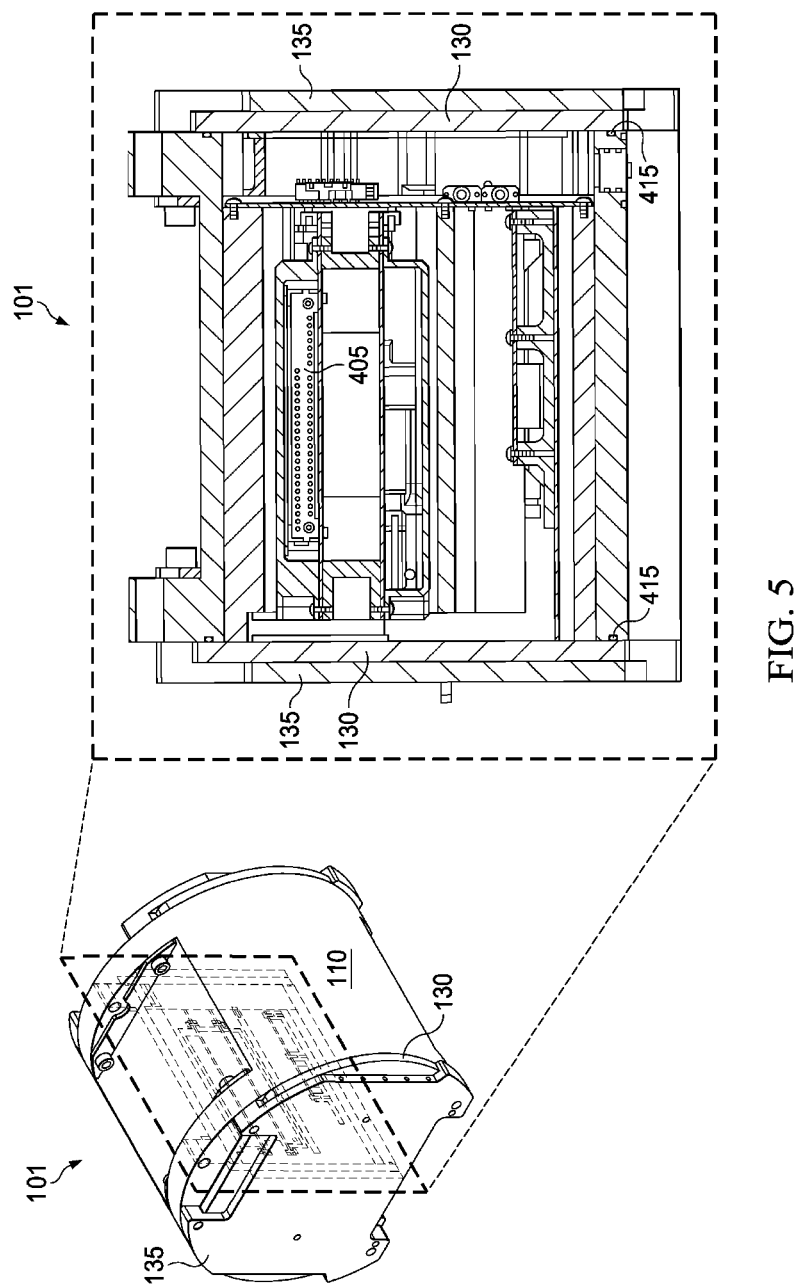
Figure 6:
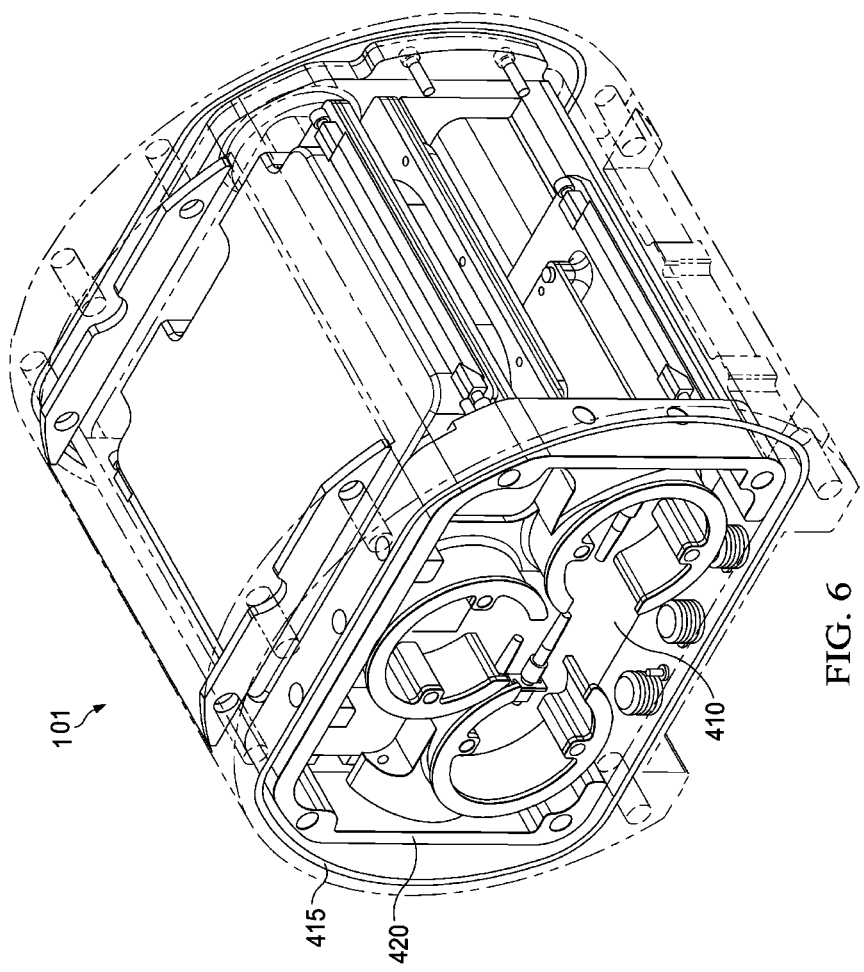

FIGS. 4 through 6 illustrate further details of an example ROADM and hotel power slice 101 of FIGS. 1 through 3 according to this disclosure. In particular, FIG. 4 illustrates an exploded view of the ROADM and hotel power slice 101, FIG. 5 illustrates a cross-sectional view of the ROADM and hotel power slice 101, and FIG. 6 illustrates an isometric view of the ROADM and hotel power slice 101 from an angle opposite that of FIG. 4. As shown in FIGS. 4 through 6, the ROADM and hotel power slice 101 includes a ceramic plate 130 and an end plate 135 disposed at each end. Each ceramic plate 130 is provided as an electrically isolating layer as discussed above.

One or more heat generating components 405 are disposed within a cavity 410 of the ROADM and hotel power slice 101. While in operation, the heat generating component(s) 405 can generate thermal energy that needs to be dissipated to avoid overheating of the heat generating component(s) 405. As discussed above, the heat generating component(s) 405 may include one or more electrical components that operate at high voltages. For example, the heat generating component(s) 405 may operate at about 10-15 kV relative to seawater ground or other external ground. The structure of the ROADM and hotel power slice 101 allows thermal energy to be transferred away from the cavity 410 while providing an electrically isolating environment for the high-voltage heat generating component(s) 405.

Surrounding the cavity 410 is an internal heat sink 420. The internal heat sink 420 absorbs thermal energy generated by the heat generating component(s) 405. The thermal energy is then transferred from the internal heat sink to the ceramic plates 130. In some embodiments, the internal heat sink 420 is formed of aluminum, such as 6061-T6 aluminum alloy, although other suitable materials are possible and within the scope of this disclosure. As generally indicated by the arrow in FIG. 4, the thermal path of the thermal energy is from the heat generating component(s) 405 to the internal heat sink 420, then to the ceramic plates 130, then to the end plates 135, and then to the surrounding pressure vessel for dissipation of the thermal energy to the exterior environment.

A seal 415 formed around a circumferential edge of the ROADM and hotel power slice 101 ensures that the cavity 410 is hermetically sealed and electrically insulated from the exterior environment. In some embodiments, the seal 415 is an O-ring formed of a synthetic rubber, such as nitrile, although other suitable materials are possible and within the scope of this disclosure.

The ROADM and hotel power slice 101 exhibits excellent thermal conductivity (such as about 78-180 W/mK) and excellent electrical insulation (such as greater than about 15 kV/mm). The design and components of the accessory slices 102-103 can be similar to those of the ROADM and hotel power slice 101 as discussed in conjunction with FIGS. 7 through 9.

Figure 7:
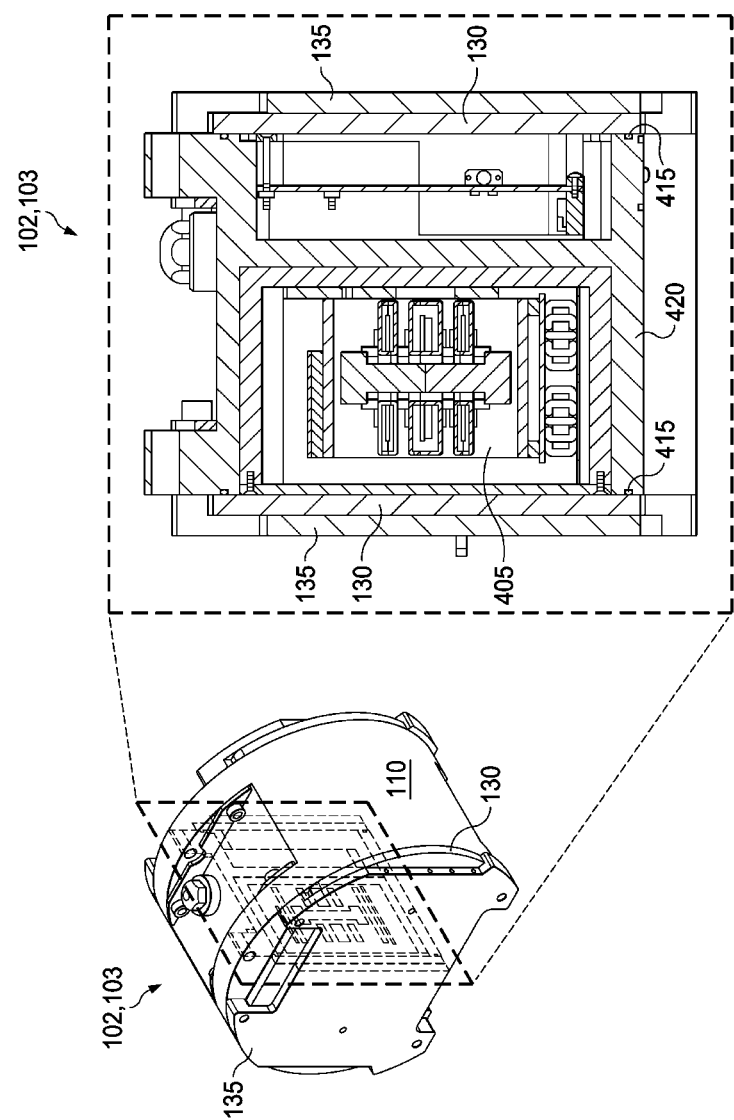
FIGS. 7 through 9 illustrate further details of an example accessory slice of FIGS. 1 through 3 according to this disclosure.
Figure 8:
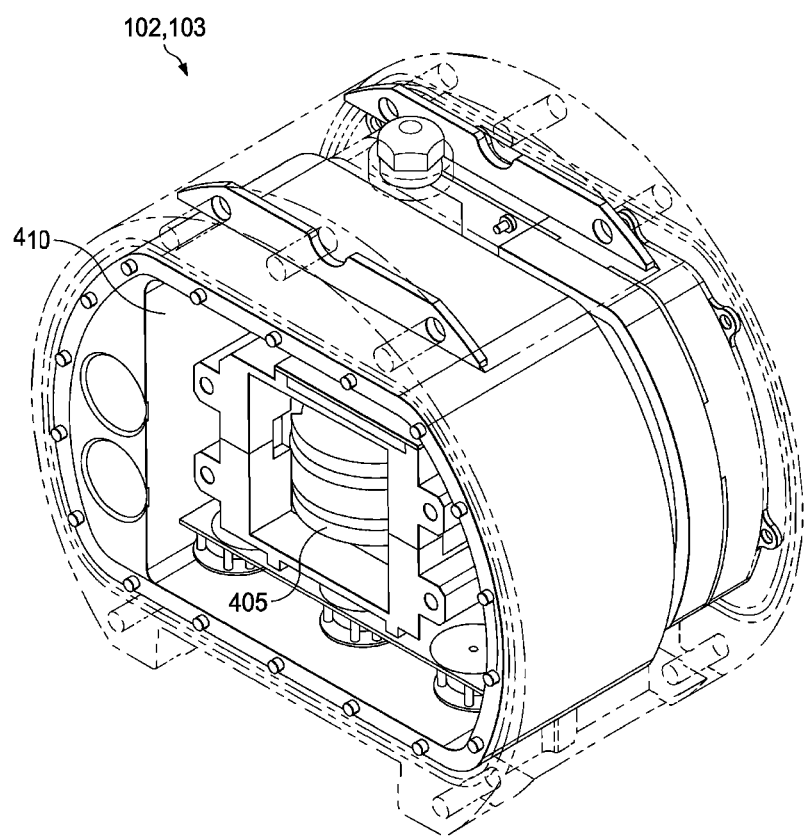
Figure 9:
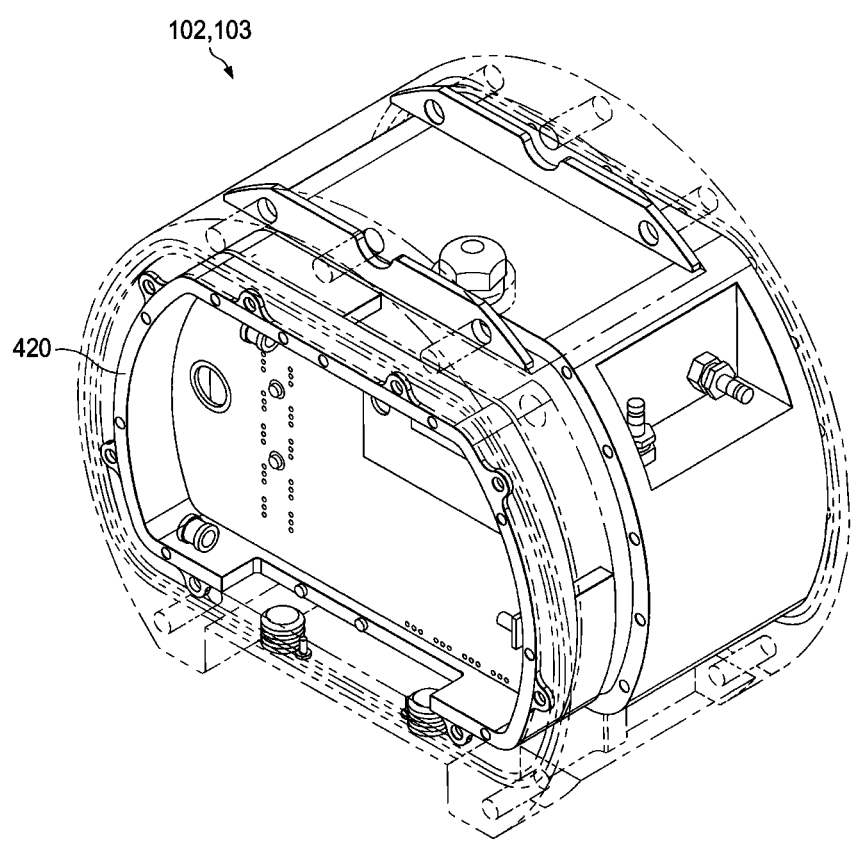

FIGS. 7 through 9 illustrate further details of an example accessory slice 102-103 of FIGS. 1 through 3 according to this disclosure. In particular, FIG. 7 illustrates a cross-sectional view of each accessory slice 102-103, FIG. 8 illustrates a front isometric view of each accessory slice 102-103, and FIG. 9 illustrates a rear isometric view of each accessory slice 102-103. As shown in FIGS. 7 through 9, each accessory slice 102-103 includes multiple components that may be the same as or similar to corresponding components of the ROADM and hotel power slice 101. For example, each accessory slice 102-103 includes a cavity 410 that houses one or more heat generating components 405. Surrounding the cavity 410 is an internal heat sink 420, which is coupled to ceramic plates 130 and end plates 135. The internal heat sink 420 absorbs thermal energy generated by the heat generating component(s) 405. The thermal energy is transferred to the ceramic plates 130, then to the end plates 135, and then to the surrounding pressure vessel for dissipation of the thermal energy to the exterior environment.

Figure 10:
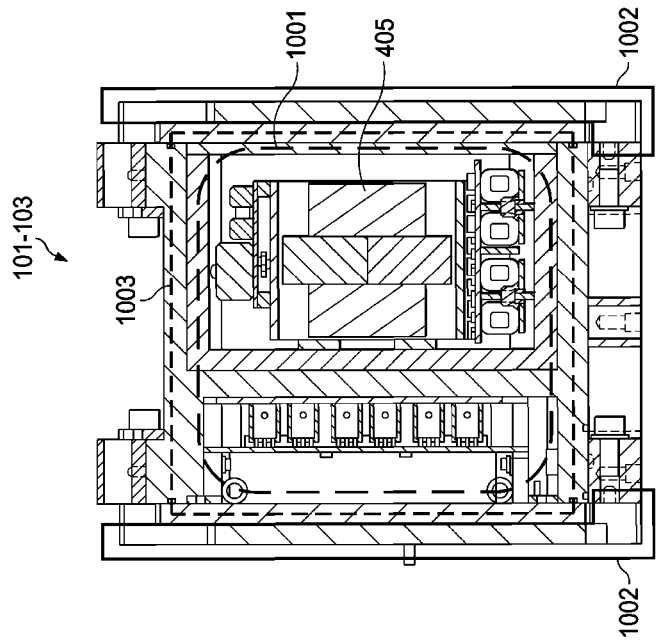
FIG. 10 illustrates example electrical boundaries of each of the slices of FIGS. 1 through 3 according to this disclosure.
Figure 10:
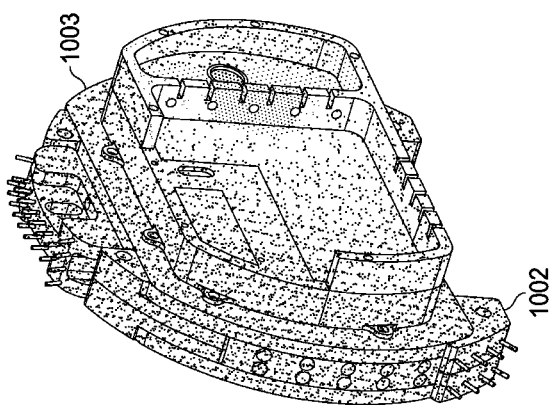

FIG. 10 illustrates example electrical boundaries of each of the slices 101-103 of FIGS. 1 through 3 according to this disclosure. As shown in FIG. 10, a cross-sectional view of one of the slices 101-103 is depicted. The line 1001 generally shows an area of internal potential. Inside the line 1001, the potential of one or more components, such as a heat generating component 405, may be about 10-15 kV relative to seawater ground or other external ground as an example. The lines 1002 generally show areas of external potential, such as seawater ground or other external ground. The line 1003 generally indicates the electrically-isolating region between the internal potential and the external potential. In the slices 101-103, the electrically-isolating region is formed by the housing 110, the backplane assembly 120, and the ceramic plates 130.

Figure 11:
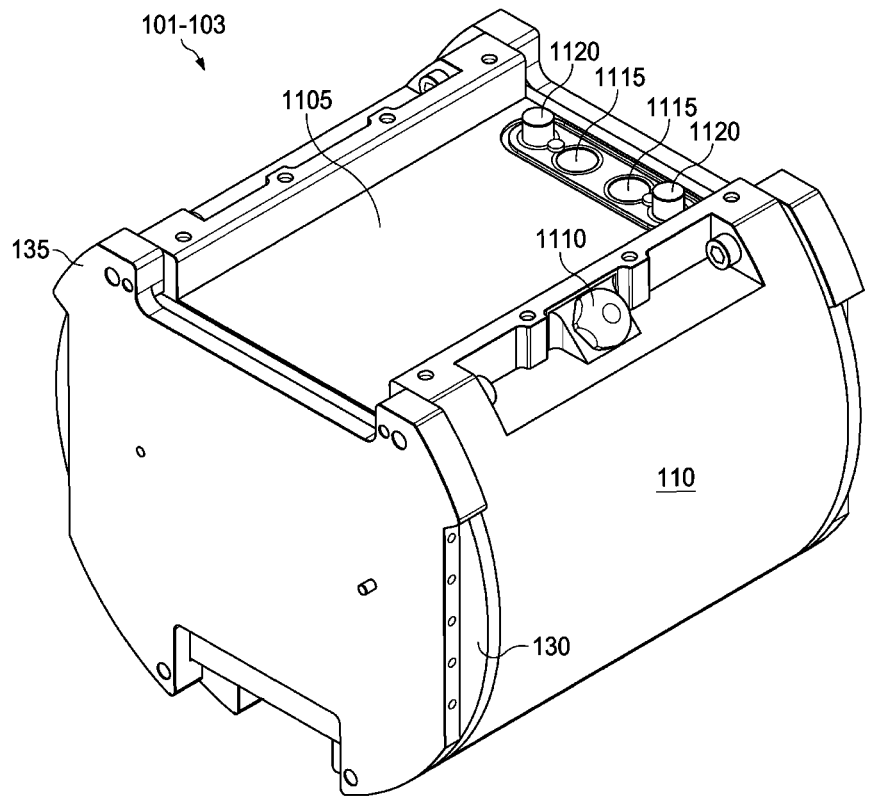
FIG. 11 illustrates further details of an example one of the slices of FIGS. 1 through 3 according to this disclosure.

FIG. 11 illustrates further details of an example one of the slices 101-103 of FIGS. 1 through 3 according to this disclosure. As shown in FIG. 11, the slice 101-103 includes an inset region 1105 that is shaped to receive a portion of the backplane assembly 120. Also, a charging port 1110 on a surface of the slice 101-103 allows access to the interior portion of the slice 101-103 for backfilling the interior portion with one or more gasses or liquids or for evacuating the interior portion to generate a vacuum or partial vacuum. A cover over the charging port 1110 can be formed of nylon or another electrically-insulative material in order to maintain the electrical isolation of the interior portion of the slice 101-103.

A surface of the inset region 1105 includes multiple feedthroughs 1115 for passage of connectors 1120 (such as wires, cables, and the like) to the internal components of the slice 101-103 (such as one or more heat generating components 405). When the slice 101-103 is connected to the backplane assembly 120, the feedthroughs 1115 align with and form a hermetic seal with corresponding feedthroughs 125 of the backplane assembly 120, thus ensuring electrical isolation of the internal components.

Although FIGS. 1 through 11 illustrate one example of a TCEI system 100 and related details, various changes may be made to FIGS. 1 through 11. For example, the TCEI system 100 and its individual components may have any suitable sizes, shapes, and dimensions. Also, various components in the TCEI system 100 may be combined, further subdivided, replicated, rearranged, or omitted and additional components may be added according to particular needs.

Figure 12:
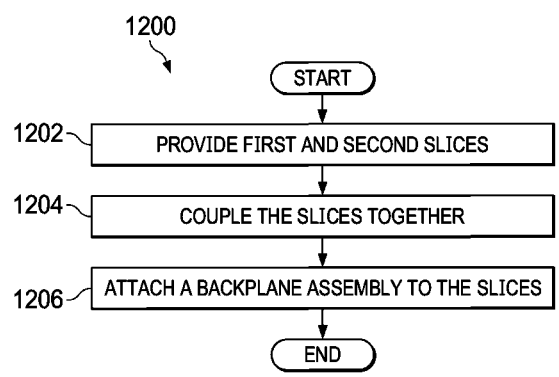
FIG. 12 illustrates an example method for assembling a TCEI system according to this disclosure.

FIG. 12 illustrates an example method 1200 for assembling a TCEI system according to this disclosure. For ease of explanation, the method 1200 is described as being performed using the TCEI system 100 of FIGS. 1 through 3. However, the method 1200 may be used with any other suitable device or system.

As shown in FIG. 12, first and second slices are provided at step 1202. This may include, for example, providing the ROADM and hotel power slice 101 and at least one of the accessory slices 102-103. Each slice can include a housing formed of an electrically-insulative material, a ceramic plate disposed at each end of the housing, and an end plate disposed over each of the ceramic plates. Each end plate can be formed of a thermally-conductive material.

The slices are coupled together at step 1204. This may include, for example, coupling the ROADM and hotel power slice 101 and at least one of the accessory slices 102-103 together. When the slices are coupled together, one end plate of the first slice can be aligned with and contact one end plate of the second slice, such as the end plates 135 being in alignment.

A backplane assembly is attached to the first and second slices at step 1206. This may include, for example, attaching the backplane assembly 120 to the ROADM and hotel power slice 101 and the accessory slice(s) 102-103. Once the first slice, the second slice, and the backplane assembly are assembled together, the TCEI system 100 may have a substantially cylindrical overall shape.

Although FIG. 12 illustrates one example of a method 1200 for assembling a TCEI system, various changes may be made to FIG. 12. For example, while shown as a series of steps, various steps shown in FIG. 12 may overlap, occur in parallel, occur in a different order, or occur multiple times. Also, some steps may be combined or removed and additional steps may be added according to particular needs.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a first slice and a second slice coupled to each other, each slice comprising:
        a housing formed of an electrically-insulative material and having an interior volume configured to contain at least one electrical component;
        ceramic plates disposed at opposite ends of the interior volume of the housing; and
        an end plate disposed over each of the ceramic plates, each end plate formed of a thermally-conductive material; and
    a backplane assembly in contact with and coupled to the first slice and the second slice.

2. The system of claim 1, wherein the housing of each slice comprises nylon.

3. The system of claim 1, wherein each end plate comprises an aluminum alloy.

4. The system of claim 1, wherein one end plate of the first slice is aligned with and contacts one end plate of the second slice.

5. The system of claim 1, wherein the first slice, the second slice, and the backplane assembly are arranged such that the system has a substantially cylindrical overall shape.

6. The system of claim 1, wherein:
    the at least one electrical component contained in the housing of each slice is configured to generate thermal energy when operating; and
    each slice further comprises an internal heat sink disposed within the slice and configured to transfer the thermal energy from the at least one electrical component to the ceramic plates.

7. The system of claim 1, wherein the backplane assembly comprises one or more feedthroughs that align with and form a hermetic seal with a corresponding feedthrough of at least one of the slices.

8. A system comprising:
    a power slice and multiple accessory slices coupled together, each slice comprising:
        a housing formed of an electrically-insulative material and having an interior volume configured to contain at least one electrical component;
        ceramic plates disposed at opposite ends of the interior volume of the housing; and
        an end plate disposed over each of the ceramic plates, each end plate formed of a thermally-conductive material; and
    a backplane assembly in contact with and coupled to the power slice and the accessory slices.

9. The system of claim 8, wherein the housing of each slice comprises nylon.

10. The system of claim 8, wherein each end plate comprises an aluminum alloy.

11. The system of claim 8, wherein one end plate of the power slice is aligned with and contacts one end plate of a first accessory slice of the multiple accessory slices.

12. The system of claim 8, wherein the power slice, the accessory slices, and the backplane assembly are arranged such that the system has a substantially cylindrical overall shape.

13. The system of claim 8, wherein:
    the at least one electrical component contained in the housing of each slice is configured to generate thermal energy when operating; and
    each slice further comprises an internal heat sink disposed within the slice and configured to transfer the thermal energy from the at least one electrical component to the ceramic plates.

14. The system of claim 8, wherein the backplane assembly comprises one or more feedthroughs that align with and form a hermetic seal with a corresponding feedthrough of at least one of the slices.

15. A method comprising:
    providing first and second slices, each slice comprising a housing formed of an electrically-insulative material and having an interior volume containing at least one electrical component, ceramic plates disposed at opposite ends of the interior volume of the housing, and an end plate disposed over each of the ceramic plates, each end plate formed of a thermally-conductive material;
    coupling the slices together; and
    attaching a backplane assembly to the first and second slices such that the backplane assembly is in contact with the first and second slices.

16. The method of claim 15, wherein the housing of each slice comprises nylon.

17. The method of claim 15, wherein each end plate comprises an aluminum alloy.

18. The method of claim 15, wherein coupling the slices together comprises:
    aligning one end plate of the first slice with one end plate of the second slice; and
    coupling the one end plate of the first slice with the one end plate of the second slice.

19. The method of claim 15, wherein the first slice, the second slice, and the backplane assembly are arranged to form a substantially cylindrical overall shape.

20. The method of claim 15, wherein:
    the at least one electrical component contained in the housing of each slice is configured to generate thermal energy when operating; and
    each slice further comprises an internal heat sink disposed within the slice and configured to transfer the thermal energy from the at least one electrical component to the ceramic plates.

* * * * *